United States Patent [19]

Penney

[11] Patent Number: 4,638,255

[45] Date of Patent: Jan. 20, 1987

[54] RECTANGULAR WAVE PULSE GENERATORS

[75] Inventor: Bruce J. Penney, Portland, Oreg.

[73] Assignee: Tektronix, Inc., Beaverton, Oreg.

[21] Appl. No.: 801,268

[22] Filed: Nov. 25, 1985

Related U.S. Application Data

[62] Division of Ser. No. 537,999, Sep. 30, 1983, abandoned.

[51] Int. Cl.$^4$ .................. H03K 3/017; H03K 3/023; H03K 5/153
[52] U.S. Cl. .................................... 328/36; 307/269; 307/359; 328/58; 328/74
[58] Field of Search ............... 307/354, 359, 362, 265, 307/269, 228; 328/13, 22, 28, 29, 36, 58, 74, 72; 340/347 AD

[56] References Cited

U.S. PATENT DOCUMENTS

| | | | |
|---|---|---|---|
| 3,509,378 | 4/1970 | Petree | 307/269 |
| 3,798,467 | 3/1974 | Gottwald | 307/354 |
| 4,187,438 | 2/1980 | Müeller | 307/354 |
| 4,326,169 | 4/1982 | Fenderson et al. | 307/359 |
| 4,418,406 | 11/1983 | Ogawa | 307/359 |

*Primary Examiner*—John Zazworsky
*Attorney, Agent, or Firm*—John Smith-Hill; Francis I. Gray

[57] ABSTRACT

The present disclosure of the invention is directed to rectangular wave pulse generators. The rectangular wave pulse generators comprise a circuit for providing a train of voltage pulses each having a trailing edge and a leading edge, at least one of said edges being of generally ramp-like form, a comparator having a first input to which said train of voltage pulses is applied, as second input to which a d.c. voltage level is applied and an output at which is developed a signal having one or two voltage levels dependent upon whether or not the voltage level of the train of voltage pulses exceeds said d.c. voltage level, whereby the comparator provides at its output a periodic rectangular wave signal having at least one transistion of which the phase is dependent upon said d.c. voltage level.

9 Claims, 4 Drawing Figures

RECTANGULAR WAVE PULSE GENERATORS

This is a division of application Ser. No. 537,999 filed Sept. 30, 1983 and now abandoned.

This invention relates to rectangular wave pulse generators.

BACKGROUND OF THE INVENTION

It is well known to convert an analog signal to digital form using a dual flash analog-to-digital converter, in which the analog signal is digitized in two successive conversion stages. The digital output of the first conversion stage is converted to analog form and is subtracted from the original analog signal, and the difference signal is applied to the second conversion stage. The desired digital signal is obtained by combining the outputs of the two conversion stages. The original analog signal is applied to the subtractor through a delay line to compensate for the propagation delay of the first conversion stage and of the digital-to-analog converter. It is necessary that the digital outputs of the two conversion stages represent the levels of the original analog signal and of the corresponding difference signal at the same point in time. This may be achieved by applying the analog signal to the converter through a sample and hold. However, conventional sample and holds degrade the analog signal to an extent that is unacceptable in some applications. The need for use of a sample and hold may be avoided by clocking the second conversion stage in delayed relation to the clocking of the first conversion stage, the delay of the clock signal being equal to the delay introduced by the delay line. The delays can be equalized either by adjusting the delay line or by adjusting the phase of the clock edge. Variable delay lines are generally more expensive than fixed delay lines, and it is difficult to adjust a variable delay line precisely.

Conventional high speed (>10 MHz) circuits, such as high speed clock generators, do not have the accurate and stable voltage characteristics that are found in low frequency (<10 kHz) circuits. One problem which arises from this limitation on conventional high speed circuits it that it is not possible, using such conventional circuits, to obtain precise control and adjustment of the phase of the clock edges of the clock signal generated by a high speed clock generator.

SUMMARY OF THE INVENTION

According to the present invention there is provided a retangular wave pulse generator, comprising a circuit for providing a train of voltage pulses each having a trailing edge and a leading edge, at least one of said edges being of generally ramp-like form, a comparator having a first input to which said train of voltage pulses is applied, a second input to which a d.c. voltage level is applied and an output at which is developed a signal having one or two voltage levels dependent upon whether or not the voltage level of the train of voltage pulses exceeds said d.c. voltage level, whereby the comparator provides at its output a periodic rectangular wave signal having at least one transition of which the phase is dependent upon said d.c. voltage level.

For a better understanding of the invention, and to show how the same may be carried into effect, reference will now be made, by way of example, to the accompanying drawing in which.

DETAILED DESCRIPTION

Figure 1:
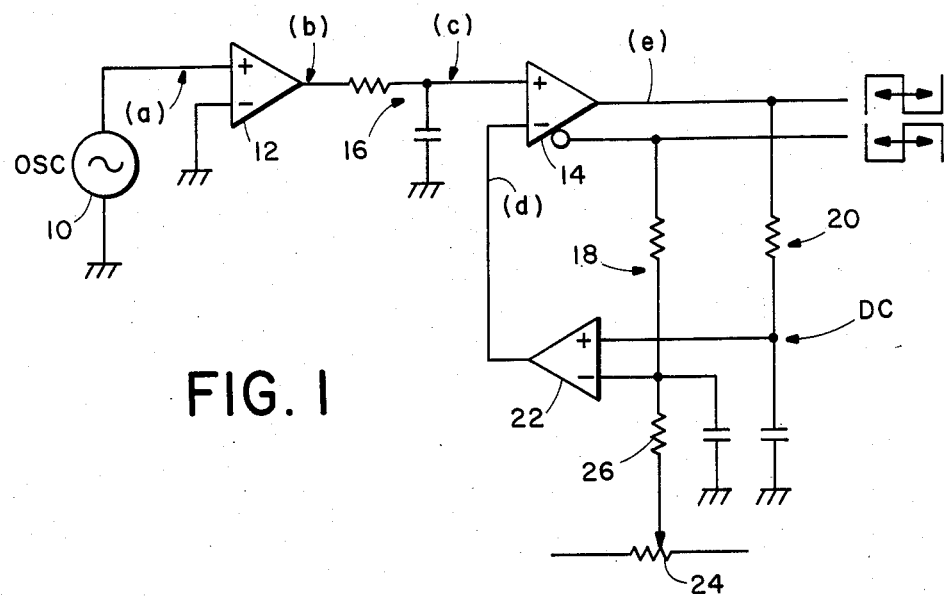
FIG. 1 is a circuit schematic, partly in block form, illustrating a rectangular wave pulse generator embodying the present invention.
Figures 2A, 2B:
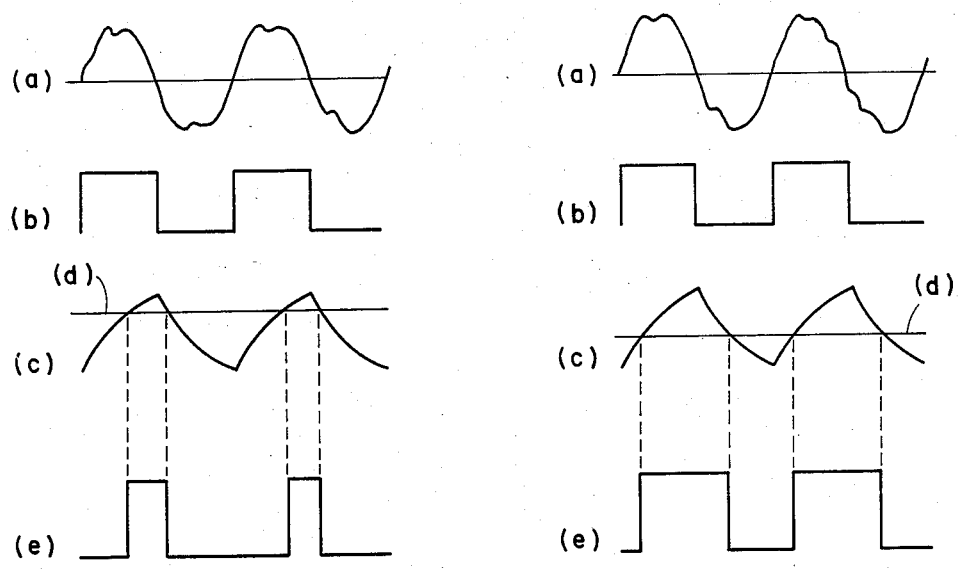
FIGS. 2A and 2B are timing diagrams illustrating the operation of the pulse generator shown in FIG. 1.

The circuit illustrated in FIG. 1 comprises an oscillator 10 which provides a periodic output signal (waveform (a) in FIGS. 2A and 2B) which is stable in frequency, as determined by the intervals between the zero voltage crossing points of the output waveform, but which has an otherwise unstable voltage waveform. The output signal from the oscillator 10 is applied to the non-inverting input of a comparator 12, the inverting input of which is grounded. The comparator 12 thus provides a square wave output so that the pulse falling edges occur midway between the pulse rising edges. As used herein, the term "rectangular wave" means a periodic wave having two voltage levels and essentially instantaneous transitions between the two voltage levels, so that when the wave is displayed on a conventional oscilloscope the voltage levels are represented by horizontal lines and the transitions by vertical lines, and the term "square wave" means a rectangular wave having a duty cycle (the ratio of the time spent at one level to the duration of a period of the wave) of 50%. The output waveform from the comparator 12 is represented by the waveform (b) in FIGS. 2A and 2B. The square wave output from the comparator 12 is applied to the non-inverting input of a second comparator 14 through a low pass filter 16 having a time constant which is substantially greater than the half period of the square wave output signal from the comparator 12. Accordingly, the signal applied to the non-inverting input of the comparator 14 has the configuration shown by the waveform (c) in FIGS. 2A and 2B, so that the rising and falling edges of the waveform have a limited slew rate. The inverting input of the comparator 14 receives a d.c. voltage (represented by the waveform (d) in FIGS. 2A and 2B) which is generated in the manner described hereafter, and consequently the output signal provided at the non-inverting output of the comparator 14, and represented by the waveform (e) of FIGS. 2A and 3B, has a duty cycle which depends on the voltage level of the d.c. signal. Thus, the phase of falling edges relative to the rising edges can be varied, as shown by a comparison of FIGS. 2A and 2B which correspond to different levels of the d.c. voltage signal.

The d.c. signal that is applied to the inverting input of the comparator 14 is generated in a feedback loop which comprises low pass filters 18 and 20 connected to the inverting and non-inverting outputs respectively of the comparator 14 and an operational amplifier 22 having its inverting and non-inverting inputs connected to the low pass filters 18 and 20. The inverting input of the amplifier 22 is connected to a potentiometer 24 through a resistor 26 having a resistance value which is much greater than the resistance values of the resistors in the filters 18 and 20, and its output is connected to the inverting input of the comparator 14.

The signals provided by the low pass filters 18 and 20 represent the d.c. levels of the two output signals provided by the comparator 14.

The d.c. levels of the output signals provided by the comparator 14 are each dependent upon the duty cycle of the signal provided on the non-inverting output of the comparator 14, but by combining the two d.c. levels in the amplifier 22 the effect of temperature and supply voltage dependent variation in the output voltage levels of the comparator are eliminated by common mode rejection.

The potentiometer 24 makes it possible to shift the level of the d.c. voltage applied to the inverting input of the comparator 14, the thereby adjust the duty cycle of the non-inverted output signal from the comparator. Since the resistance value of the resistor 26 is large, the resistor 26 acts as a current source and therefore the potentiometer 24 does not affect significantly the corrections accomplished by the comparator 22 by common mode rejection.

Figure 3:
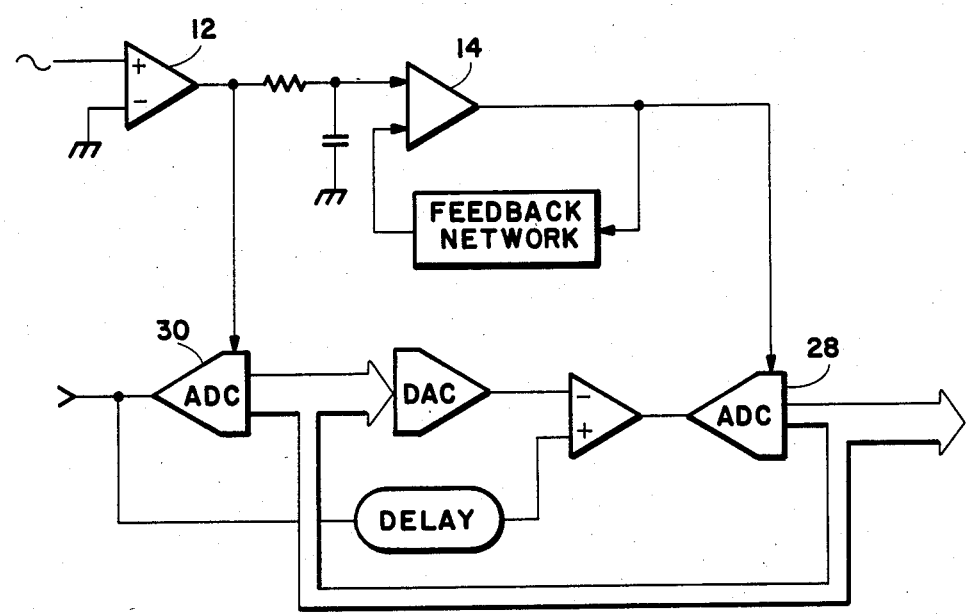
FIG. 3 is a simplified block diagram of a dual flash analog-to-digital converter including a pulse generator in accordance with FIG. 1.

The illustrated pulse generator may be used to provide a clock pulse signal having clock edges (negative going or positive going) which can be precisely controlled and adjusted in phase. Thus, as shown in FIG. 3, the pulse generator can be used to provide accurately delayed clock pulses for the second conversion stage 28 of a dual flash analog-to-digital converter, the clock pulses for the first conversion stage 30 being derived from the output of the comparator 12.

It will, of course, be appreciated that the invention is not restricted to the particular circuit which has been illustrated and described, since variations may be made therein without departing from the scope of the invention as defined in the appended claims, and equivalents thereof. For example, it is not necessary that both edges of the signal applied to the non-inverting input of the comparator 14 having a ramp-like form, since it is generally necessary to provide for variation of the phase of one of the edges of the output signal of the comparator. Also, in the event that correction for logic level errors is not required, the feedback loop could be omitted and the voltage signal representing the desired phase of the clock edge could be applied directly to the inverting input of the comparator 14.

I claim:

1. Signal processing apparatus comprising:
   an electronic device having a signal input, a signal output and a clock input;
   a circuit having an output at which it provides a first train of voltage pulses;
   means for converting said first train of voltage pulses into a second train of voltage pulses each having a trailing edge and a leading edge, at least one of said edges being of generally ramp-like form;
   a comparator having a first input to which said second train of voltage pulses is applied, a second input to which a reference d.c. voltage level is applied and an output at which is developed a periodic rectangular wave signal having a duty cycle which is a function of the reference d.c. voltage level, the periodic rectangular wave signal being input to the clock input of said electronic device such that said electronic device is clocked by the periodic rectangular wave signal in a time relationship to said first train of voltage pulses that is adjustable in dependence upon said reference d.c. voltage level; and
   means for generating the reference d.c. voltage level from the periodic rectangular wave signal.

2. Signal processing apparatus according to claim 1, further comprising means for adjusting said reference d.c. voltage level independently of the d.c. level of said periodic rectangular wave signal, whereby the duty cycle of said periodic rectangular wave signal may be adjusted.

3. Signal processing apparatus according to claim 1, wherein the generating means comprises feedback means for generating said reference d.c. voltage level from the d.c. level of said rectangular wave signal.

4. Signal processing apparatus according to claim 3, wherein the comparator has a first output that is connected to the clock input of the electronic device and a second output at which is developed a signal that is the complement of the signal developed at the first output, and wherein said feedback means generates said reference d.c. voltage level by forming the difference between the d.c. levels of the rectangular wave signals provided at said first and second outputs respectively.

5. Signal processing apparatus according to claim 1, wherein said circuit comprises an oscillator for generating a periodic signal and an oscillator comparator for converting said periodic signal into said first train of voltage pulses.

6. Signal processing apparatus according to claim 1, wherein the means for converting said first train of voltage pulses into said second train of voltage pulses comprise a low pass filter having a time constant which is substantially greater than the half period of said periodic signal.

7. Signal processing apparatus according to claim 1, comprising a second electronic device having a signal input, a signal output and a clock input, and wherein the output of said circuit is connected to the clock input of the second electronic device, whereby said electronic devices are clocked in a time relationship that is adjustable in dependence upon said reference d.c. voltage level.

8. Signal processing apparatus according to claim 7, wherein the two electronic devices comprise respective analog-to-digital converters, and the apparatus further comprises a digital-to-analog converter having an input connected to the signal output of one analog-to-digital converter and also having an output, a subtractor having a first input connected to the output of the digital-to-analog converter, a second input connected to the signal input of said one analog-to-digital converter and an output connected to the signal input of the other analog-to-digital converter.

9. Signal processing apparatus according to claim 8, wherein said one analog-to-digital converter is the second electronic device and said other analog-to-digital converter is the first-mentioned electronic device.

* * * * *